US 6,982,571 B2

(12) United States Patent
Eldredge et al.

(10) Patent No.: US 6,982,571 B2
(45) Date of Patent: Jan. 3, 2006

(54) SYSTEMS AND METHODS FOR TRANSLATING VOLTAGE LEVELS OF DIGITAL SIGNALS

(75) Inventors: Kenneth J. Eldredge, Boise, ID (US); Michael C. Allyn, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 159 days.

(21) Appl. No.: 10/727,402

(22) Filed: Dec. 4, 2003

(65) Prior Publication Data

US 2005/0122133 A1 Jun. 9, 2005

(51) Int. Cl.
*H03K 19/0175* (2006.01)

(52) U.S. Cl. .......................................... 326/63; 326/80
(58) Field of Classification Search ....... 326/62–63,80, 326/82; 327/108, 333
See application file for complete search history.

(56) References Cited

U.S. PATENT DOCUMENTS

| 6,107,857 A | * | 8/2000 | Orisaka et al. | ............. 327/333 |
| 6,369,612 B1 | * | 4/2002 | Shokouhi | ..................... 326/68 |
| 6,522,323 B1 | * | 2/2003 | Sasaki et al. | ............... 345/204 |
| 6,636,071 B1 | * | 10/2003 | Yatabe | ........................ 326/80 |

* cited by examiner

Primary Examiner—James H. Cho

(57) ABSTRACT

Systems for translating voltage levels of digital signals are provided. An exemplary system comprises a circuit board operative to use a first digital signal and a second digital signal. The first digital signal operates between a first voltage and a second voltage, with the first voltage corresponding to a logic 0 and the second voltage corresponding to a logic 1. The second digital signal operates between a third voltage and a fourth voltage, with the third voltage and the fourth voltage exhibiting an average value, the absolute value of which is at least an order of magnitude different than an average value of the first voltage and the second voltage. The circuit board is further operative to use the first digital signal to produce the second digital signal. Methods and other systems also are provided.

20 Claims, 3 Drawing Sheets

SYSTEMS AND METHODS FOR TRANSLATING VOLTAGE LEVELS OF DIGITAL SIGNALS

BACKGROUND

Oftentimes, it is desirable to provide digital signals operating at one voltage level to some components of an electrical system, while providing other digital signals operating at another voltage level to other components of the system. In a system in which groups of components operate with digital signals of disparate voltage levels, it is possible to generate different digital signals for each group of components. However, such an arrangement tends to create various problems. For example, it is often necessary to provide separate components for generating and transmitting each of the independent digital signals. Clearly, when the degree of miniaturization is a design consideration of such a system, providing additional components can be problematic.

SUMMARY

Systems and methods for translating voltage levels of digital signals are provided. In this regard, an embodiment of a system comprises a circuit board operative to use a first digital signal and a second digital signal. The first digital signal operates between a first voltage and a second voltage, with the first voltage corresponding to a logic 0 and the second voltage corresponding to a logic 1. The second digital signal operates between a third voltage and a fourth voltage, with the third voltage and the fourth voltage exhibiting an average value, the absolute value of which is at least an order of magnitude different than an average value of the first voltage and the second voltage. The circuit board is further operative to use the first digital signal to produce the second digital signal.

An embodiment of a method for translating voltage levels of digital signals comprises providing a circuit board; providing, on the circuit board, a first digital signal operating between a first voltage and a second voltage, the first voltage corresponding to a logic 0 and the second voltage corresponding to a logic 1; and providing, on the circuit board, a second digital signal operating between a third voltage and a fourth voltage, the third voltage and the fourth voltage exhibiting an average value, the absolute value of which is at least an order of magnitude different than an average value of the first voltage and the second voltage, the first voltage and the second voltage being used to produce the second digital signal.

Another embodiment of a method comprises providing a first digital signal operating between a first voltage and a second voltage, the first voltage corresponding to a logic 0 and the second voltage corresponding to a logic 1; providing the first digital signal as an input to a capacitive element, an output of the capacitive element being electrically connected in parallel to a first branch and a second branch, the first branch being electrically connected to a third voltage, the second branch being electrically connected to a fourth voltage; and causing the first and second voltages to interact with the first branch and the second branch such that a second digital signal is produced, the second digital signal operating between the third voltage and the fourth voltage.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

As will be described in detail here, systems and methods for translating voltage levels of digital signals can be used when digital signals are to be propagated between components that operate at disparate voltage levels. Specifically, the systems and methods involve the use of capacitive elements, e.g., capacitors, that maintain a voltage separation between the digital signals operating at their respective voltage levels.

Figure 1:
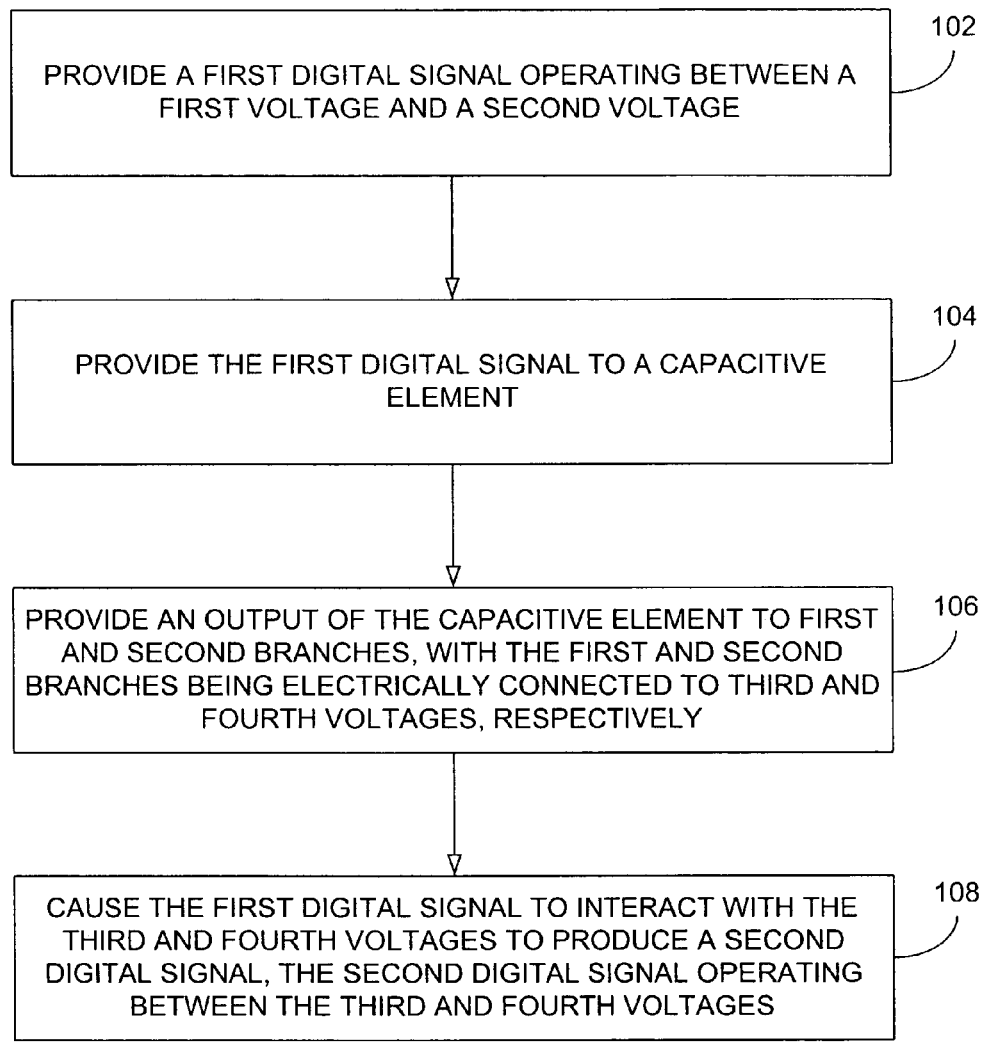
FIG. 1 is a flowchart depicting functionality of an embodiment of a system for translating voltage levels of digital signals.

Reference will now be made to the flowchart of FIG. 1, which depicts functionality of an embodiment of a method for translating voltage levels of digital signals. As depicted in FIG. 1, the method may be construed as beginning at block 102, where a first digital signal operating between first and second voltages is provided. Specifically, the first and second voltages correspond to the logic values "0" and "1," respectively. By way of example, the first voltage can be 0 V, i.e., ground, and the second voltage can be +5 V. In block 104, the first digital signal is provided to a capacitive element. In block 106, output of the capacitive element is provided to first and second branches, with the first branch being electrically connected to a third voltage and the second branch being electrically connected to a fourth voltage. In block 108, the first digital signal interacts with the first and second branches so that a second digital signal is produced. Specifically, the second digital signal operates between the third voltage and the fourth voltage. For instance, the third voltage value can be approximately −695 V, and the fourth voltage can be approximately −700 V.

Figure 2:
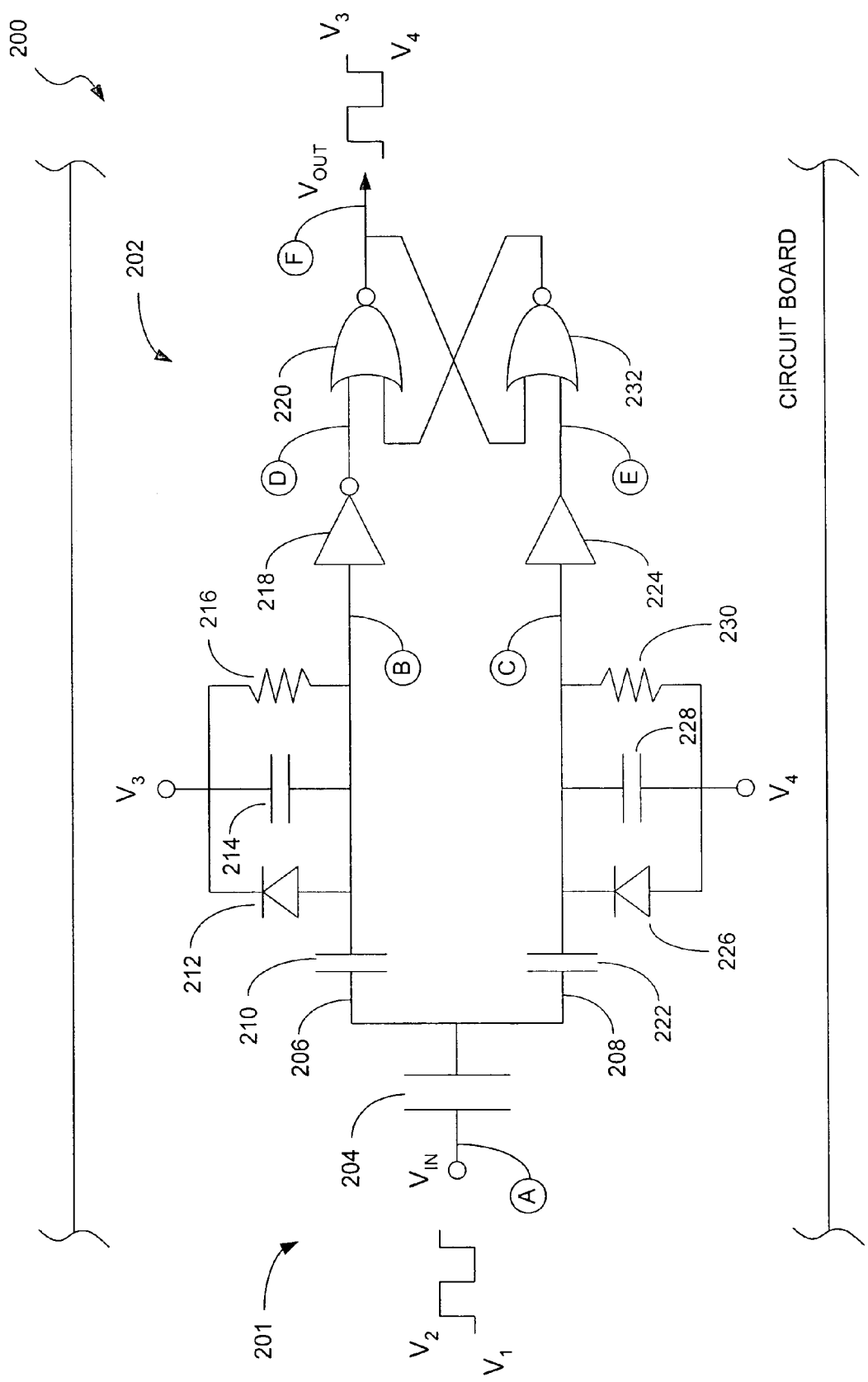
FIG. 2 is a schematic diagram depicting an embodiment of a system for translating voltage levels of digital signals.

An embodiment of a system for translating voltage levels of digital signals will now be described with respect to the schematic diagram of FIG. 2. As shown in FIG. 2, circuit 200 includes a first portion 201, which uses ground-level digital signals (0 to 5 V), and a second portion 202, which uses a high potential digital signals (−700 to −695 V). The location of demarcation between the first and second portions of the circuit is a capacitor 204 that electrically separates the disparate voltage levels of the two portions. Note, in some embodiments, the first portion and the second portion of the circuit 200 are located on the same circuit board.

Node $V_{IN}$ is electrically connected to one side of capacitor 204, with first and second branches 206, 208 being electrically connected in parallel to the other side of the capacitor 204. Branch 206 includes a capacitor 210 and voltage input $V_3$. Voltage input $V_3$ is electrically connected to branch 206 via a diode 212, capacitor 214 and resistor 216. Diode 212, capacitor 214 and resistor 216 are electrically connected in parallel with respect to each other. Branch 206 also includes an inverting driver 218 that provides its output as an input to a NORgate 220.

In contrast, branch 208 includes a capacitor 222 and a non-inverting driver 224. A voltage input $V_4$ is electrically connected between capacitor 222 and driver 224 via diode 226, capacitor 228 and resistor 230. Diode 226, capacitor 228 and resistor 230 are electrically connected in parallel with respect to each other. In branch 208, the output of driver 224 is provided as an input to NORgate 232. The output of NORgate 232 is provided as the second input of NORgate 220. Similarly, the output of NORgate 220 is provided as the second input of NORgate 232. Thus, the NORgates 220 and 232 function as a digital signal latch.

In operation, a square (digital) waveform oscillating between voltage levels $V_1$ and $V_2$ is provided as input at node $V_{IN}$. The rising and falling edges of that waveform cause the analog components of branches 206 and 208 to change the outputs of the downstream logic components to produce, at $V_{OUT}$, a replica of the input waveform. However, the operating voltages of the output waveform are translated to $V_4$ and $V_3$.

Operation of the circuit 200 will now be described in greater detail with respect to the timing diagrams of FIG. 3. Note that various locations of the circuit diagram of FIG. 2 are annotated with letter designations A–F. Each of the waveforms shown in FIG. 3 depicts the voltage level exhibited at each of the locations A–F.

Figure 3:
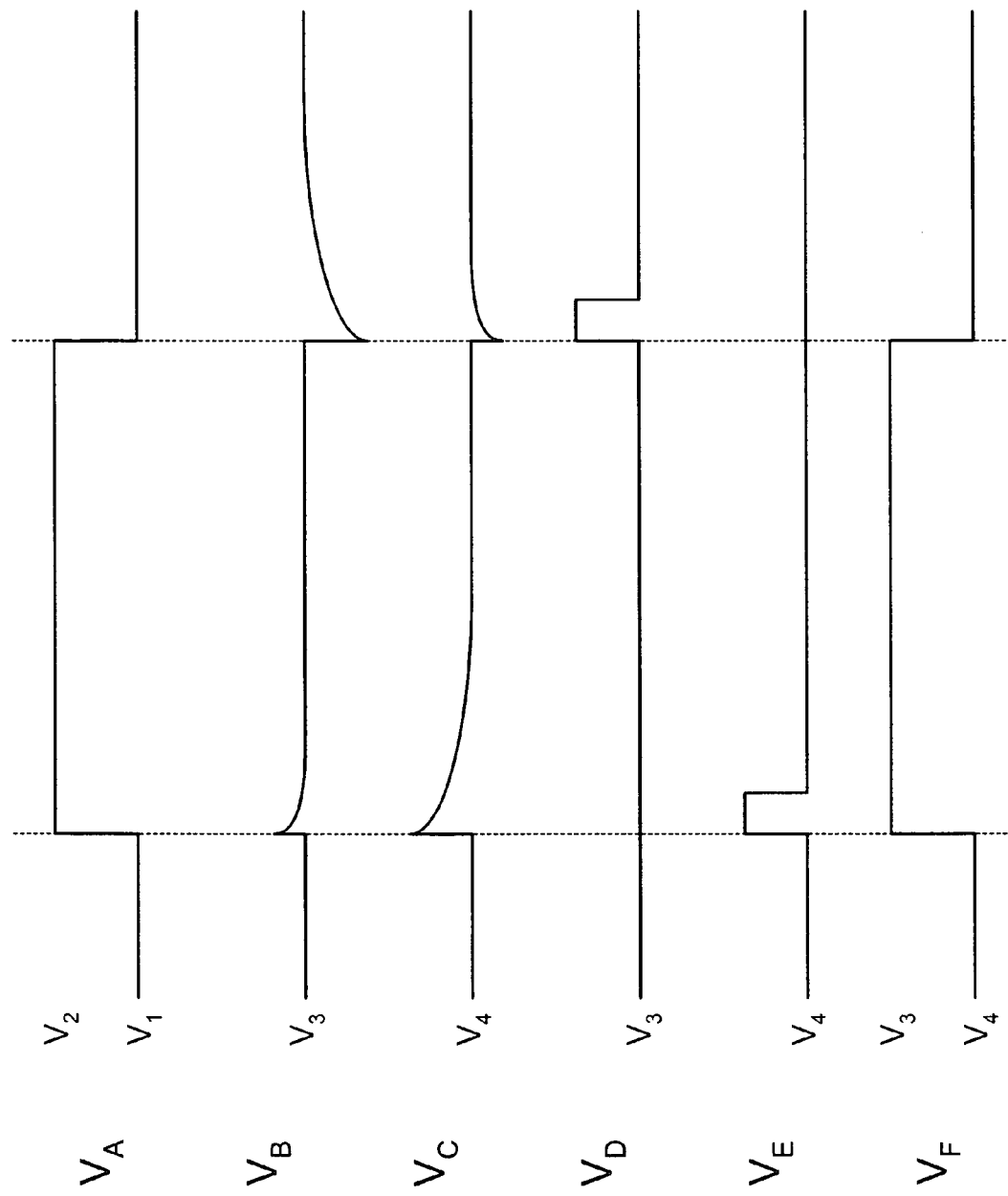
FIG. 3 is a timing diagram of the embodiment of FIG. 2.

As shown in FIG. 3, the voltage at location A ($V_A$) is that of the input waveform, with the voltage level varying between levels $V_1$ and $V_2$. Comparing the waveform $V_A$ with the waveform $V_B$, the rising edge of $V_A$ causes a rise in $V_B$ as the increase in voltage of $V_A$ traverses capacitor 204. Diode 212 clamps the voltage rise, i.e., limits the voltage rise, to a value of a diode drop. In this case, the voltage rise is approximately 0.7 volts. After the initial spike, $V_B$ decays to the value of $V_3$ as a result of the interaction between capacitor 214 and resistor 216. Note that the values for the capacitor 214 and resistor 216 should be selected to allow the voltage transients $V_B$ and $V_C$ to be above the logic threshold for the minimum required time for the buffers and the NORgates.

The falling edge of the waveform corresponding to $V_A$ results in a voltage drop at $V_B$, with the drop in $V_B$ corresponding to a difference between voltages $V_2$ and $V_1$. In some embodiments, the voltage difference between $V_2$ and $V_1$ approximates the voltage difference between $V_3$ and $V_4$. By way of example, if $V_2$ is approximately 5 volts and $V_1$ is ground (approximately 0V), $V_3$ and $V_4$ could be –695 volts and –700 V, respectively. This equates to a voltage difference of 5 V in the portion of the circuit to the left of capacitor 204 and a 5 V difference between the components to the right of the capacitor 204. After the voltage peak in $V_B$ associated with the falling edge of $V_A$, the waveform of $V_B$ recharges to level $V_3$.

The voltage levels exhibited at location C also vary in relation to voltage $V_A$. Specifically, at the rising edge of $V_A$, a 5 V spike is exhibited, which then decays back to $V_4$. At the falling edge of $V_A$, a negative voltage spike corresponding to a diode drop is exhibited. This voltage level then recharges back to $V_4$ in relation to the time constant of capacitor 228 and resistor 230.

The analog voltages $V_B$ and $V_C$ are converted to digital voltage levels using the inverting driver 218 and non-inverting driver 224, respectively. As shown in FIG. 3, the relatively large magnitude drop in voltage of $V_B$, which corresponds to the falling edge of $V_A$, translates to a logic "1" being output by the inverting driver 218. Note that the width of the logic "1" is determined by the characteristics of the RC circuit associated with $V_3$. In contrast, the analog voltage $V_C$ is converted to a digital voltage represented by $V_E$. As shown, the rising edge of $V_A$ and corresponding rising edge of $V_C$ cause the driver 224 to output a logic "1."

The digital pulses provided by $V_D$ and $V_F$ control the digital output $V_{OUT}$, which is represented by waveform $V_F$. Specifically, the logic "1" provided by $V_E$ turns "ON" the logic pulse of waveform $V_F$, and the logic "1" of waveform $V_D$ turns the logic pulse of waveform $V_F$ "OFF." Thus, waveform $V_F$ replicates waveform $V_A$, although the voltages of the waveform $V_F$ vary between $V_4$ and $V_3$.

It should be emphasized that many variations and modifications may be made to the above-described embodiments. By way of example, some embodiments can incorporate additional components, such as diodes. For instance, an additional diode can be included in each of the first and second branches, such as at the locations identified by 206 and 208 of FIG. 2. Each of these diodes could function to isolate the source impedance from the discharge path. Also note that the choice of analog components influences the start and duration of the buffer output pulses. These components should be selected so that the output waveform will have a duty cycle that closely approximates the input waveform. Since these characteristics are known, an appropriate selection of components can be readily accomplished by one of ordinary skill in the art. All such modifications and variations are intended to be included herein within the scope of this disclosure and protected by the following claims.

What is claimed is:

1. A method for translating voltage levels of digital signals, said method comprising:
   providing a first digital signal operating between a first voltage and a second voltage, the first voltage corresponding to a logic 0 and the second voltage corresponding to a logic 1;
   providing the first digital signal as an input to a capacitive element, an output of the capacitive element being electrically connected in parallel to a first branch and a second branch, the first branch being electrically connected to a third voltage, the second branch being electrically connected to a fourth voltage; and
   causing the first and second voltages to interact with the first branch and the second branch such that a second digital signal is produced, the second digital signal operating between the third voltage and the fourth voltage;
   wherein the first branch comprises a first diode and a first RC circuit electrically connected in parallel, and the second branch comprises a second diode and a second RC circuit electrically connected in parallel.

2. The method of claim 1, wherein the first voltage corresponds to ground, and the second voltage is approximately 5 V.

3. The method of claim 1, wherein the third voltage is approximately 695 V, and the fourth voltage is approximately 700 V.

4. The method of claim 1, wherein the third voltage and the fourth voltage exhibit an average value, the absolute value of which is at least an order of magnitude different than an average value of the first voltage and the second voltage.

5. The method of claim 1, further comprising:
   providing a first NORgate electrically connected to the first branch; and
   providing a second NORgate electrically connected to the second branch, the first NORgate and the second NORgate functioning as a digital signal latch.

6. The method of claim 5, further comprising:
providing an inverting driver electrically connected in series between the capacitor and the first input of the first NORgate; and
providing a non-inverting driver electrically connected in series between the capacitor and the first input of the second NORgate.

7. A method for translating voltage levels of digital signals, said method comprising:
providing a circuit board;
providing, on the circuit board, a first digital signal operating between a first voltage and a second voltage, the first voltage corresponding to a logic 0 and the second voltage corresponding to a logic 1;
providing, on the circuit board, a second digital signal operating between a third voltage and a fourth voltage, the third voltage and the fourth voltage exhibiting an average value, wherein the average value has an absolute value that is at least an order of magnitude different than an average value of the first voltage and the second voltage, the first voltage and the second voltage being used to produce the second digital signal;
providing, on the circuit board, a capacitor electrically connected between the first digital signal and the second digital signal, the capacitor being selected to prevent voltage levels associated with the second digital signal from altering the first digital signal; and
providing a first branch and a second branch electrically connected in parallel with an output of the capacitor, the first branch including a first diode and a first RC circuit electrically connected in parallel between a source of the third voltage and the capacitor, the second branch including a second diode and a second RC circuit electrically connected in parallel between a source of the fourth voltage and the capacitor.

8. The method of claim 7, wherein the first voltage corresponds to ground, and the second voltage is approximately 5 V.

9. The method of claim 7, wherein the third voltage is approximately −695 V, and the fourth voltage is approximately −700 V.

10. The method of claim 7, wherein a difference between the first voltage and the second voltage is approximately equal to a difference between the third voltage and the fourth voltage.

11. The method of claim 7, further comprising:
providing a first NORgate electrically connected to the first branch; and
providing a second NORgate electrically connected to the second branch, the first NORgate and the second NORgate functioning as a digital signal latch.

12. The method of claim 11, further comprising:
inverting a signal provided to the first input of the first NORgate.

13. A system for translating voltage levels of digital signals comprising:
a circuit board operative to use a first digital signal and a second digital signal, the first digital signal operating between a first voltage and a second voltage, the first voltage corresponding to a logic 0 and the second voltage corresponding to a logic 1, the second digital signal operating between a third voltage and a fourth voltage, the third voltage and the fourth voltage exhibiting an average value, having an absolute value that is at least an order of magnitude different than an average value of the first voltage and the second voltage,
the circuit board being further operative to use the first digital signal to produce the second digital signal;
wherein the circuit board comprises:
a capacitor located to receive the first digital signal, the capacitor being operative to prevent the third voltage and the fourth voltage from altering the first digital signal; and
a first branch and a second branch electrically connected in parallel with an output of the capacitor, the first branch including a first diode and a first RC circuit electrically connected in parallel between a source of the third voltage and the capacitor, the second branch including a second diode and a second RC circuit electrically connected in parallel between a source of the fourth voltage and the capacitor.

14. The system of claim 13, wherein the first RC circuit is electrically equivalent to the second RC circuit.

15. The system of claim 13, further comprising:
means for latching the second digital signal.

16. The system of claim 13, wherein the circuit board further comprises:
a first NORgate having a first input, a second input and an output, the first input of the first NORgate being electrically connected to the first branch; and
a second NORgate having a first input, a second input and an output, the first input of the second NORgate being electrically connected to the second branch, the output of the second NORgate being electrically connected to the second input of the first NORgate, the output of the first NORgate being electrically connected to the second input of the second NORgate such that the first NORgate and the second NORgate function as a digital signal latch.

17. The system of claim 16, wherein the circuit board further comprises:
an inverting driver electrically connected in series between the capacitor and the first input of the first NORgate; and
a non-inverting driver electrically connected in series between the capacitor and the first input of the second NORgate.

18. The system of claim 13, wherein the first voltage corresponds to ground, and the second voltage is approximately 5 V.

19. The system of claim 13, wherein the third voltage is approximately −695 V, and the fourth voltage is approximately −700 V.

20. The system of claim 13, wherein a difference between the first voltage and the second voltage is approximately equal to a difference between the third voltage and the fourth voltage.

* * * * *